United States Patent
Terpstra et al.

(10) Patent No.: US 6,410,395 B1
(45) Date of Patent: Jun. 25, 2002

(54) METHOD OF MANUFACTURING A SEMICONDUCTOR DEVICE COMPRISING SIGE HBTS

(75) Inventors: Doede Terpstra; Jan Willem Slotboom; Youri Ponomarev; Petrus Hubertus Cornelis Magnee, all of Eindhoven; Freerk Van Rijs, Nijmegen, all of (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 5 days.

(21) Appl. No.: 09/713,865

(22) Filed: Nov. 16, 2000

(30) Foreign Application Priority Data

Nov. 18, 1999 (EP) .............................. 99203850

(51) Int. Cl.$^7$ ........................................... H01L 21/331
(52) U.S. Cl. ...................... 438/312; 438/313; 438/322
(58) Field of Search ................ 438/312, 309, 438/313, 322, 203

(56) References Cited

U.S. PATENT DOCUMENTS 5,846,867 A * 12/1998 Gomi et al. ............... 438/318
5,912,479 A * 6/1999 Mori et al. ................. 257/192
5,930,635 A * 7/1999 Bashir et al. ............... 438/313
6,043,552 A * 2/2000 Miwa ......................... 257/587

FOREIGN PATENT DOCUMENTS

EP 0551185 A2 7/1993
EP 0607836 A2 7/1994

* cited by examiner

Primary Examiner—Tuan H. Nguyen
(74) Attorney, Agent, or Firm—Aaron Waxler

(57) ABSTRACT

A method of manufacturing a semiconductor device comprising heterojunction bipolar transistors (HBTs), in which method a first semiconductor layer of monocrystalline silicon (5), a second semiconductor layer of monocrystalline silicon comprising 5 to 25 at. % germanium (6) and a third semiconductor layer of monocrystalline silicon (7) are successively provided on a surface (2) of a silicon wafer (1) by means of epitaxial deposition. Base zones of the transistors are formed in the second semiconductor layer. In this method, the second semiconductor layer is deposited without a base doping, said doping being formed at a later stage. Said doping can be formed by means of an ion implantation process or a VPD (Vapor Phase Doping) process. This method enables integrated circuits comprising npn-transistors as well as pnp-transistors to be manufactured.

7 Claims, 3 Drawing Sheets

METHOD OF MANUFACTURING A SEMICONDUCTOR DEVICE COMPRISING SIGE HBTS

BACKGROUND OF THE INVENTION

The invention relates to a method of manufacturing a semiconductor device comprising bipolar transistors, in which method, in succession, a first semiconductor layer of monocrystalline silicon, a second semiconductor layer of monocrystalline silicon with 5 to 25 at. % germanium and a third semiconductor layer of monocrystalline silicon are provided on a surface of a silicon wafer by means of epitaxial deposition, base zones of the transistors being formed in the second semiconductor layer of monocrystalline silicon with germanium.

Said three semiconductor layers, i.e. including the second semiconductor layer of monocrystalline silicon to which 5 to 25 at. % germanium is added ($Si_{1-x}Ge_x$ where 0.05 <x<0.20), can be deposited by means of customary MBE (Molecular Beam Epitaxy) or CVD (Chemical Vapor Deposition) processes. The addition of germanium to silicon results in the formation of a semiconductor material having a smaller band gap than silicon. The use of transitions between semiconductor zones having different band gaps enables heterojunction-bipolar transistors (HBTs) to be realized, which are particularly suited for processing signals of a very high frequency, such as signals used in systems for wireless communication.

The addition of germanium to silicon does not only result in a semiconductor material having a smaller band gap than silicon, but also in a semiconductor material having a greater lattice constant than silicon. The deposition of the second semiconductor layer leads, in the course of this deposition process, to the development of mechanical stresses in this semiconductor layer. The size of these stresses depends upon the thickness of the deposited semiconductor layer. The thicker the semiconductor layer, the greater the stresses are. Above a critical thickness, the size of these stresses increases so much that dislocations are formed in the semiconductor layer. As a result thereof, the stresses decrease, however, the semiconductor layer has become useless. Such dislocations may also occur in a semiconductor layer which is thinner than the critical thickness but which is subjected to treatments at high temperatures. Therefore, such treatments should be precluded as much as possible. Dependent upon the quantity of germanium in the semiconductor layer, said critical thickness lies in the range between 10 and 120 nm (10 nm at 25 at. % germanium to 120 nm at 5 at. % germanium). In practice, in the manufacture of HBTs, a layer of a semiconductor material of monocrystalline silicon with germanium is used in a thickness below said critical thickness.

EP 0 551 185 discloses a method of the type mentioned in the opening paragraph, wherein, in a first process step, the first semiconductor layer of monocrystalline silicon is deposited on the surface of the silicon wafer. Areas of field oxide are subsequently formed n this first semiconductor layer by local oxidation of silicon. Next, in a second process step, the second and the third semiconductor layers are deposited. On field oxideenclosed active regions of the first layer, the second and the third layer are deposited in an epitaxial monocrystalline manner, while they are deposited in a polycrystalline manner on the areas of field oxide. The three semiconductor layers are thus deposited in two separate process steps. The second semiconductor layer of silicon contains 10 at. % germanium and is deposited in a thickness of 30 nm. The second semiconductor layer is deposited with a p-type base doping of boron having a doping concentration of $2.10^{19}$ atoms per cc.

EP 0 607 836 also discloses a method of the type mentioned in the opening paragraph, wherein the three semiconductor layers are deposited on the surface of the silicon wafer in a continuous process. Only after the bipolar transistor has been formed in the three semiconductor layers, field-isolation areas are formed by etching grooves and by subsequently filling them with an insulating material. The second semiconductor layer of silicon contains 20 at. % germanium and is deposited in a thickness of 50 nm. The second semiconductor layer is deposited with a p-type base doping of boron having a doping concentration of $1.10^{19}$ atoms per cc.

In both known methods, the second semiconductor layer of silicon to which germanium is added is provided with a base doping of boron during the deposition process. After the deposition of the layers, they are subjected as little as possible to treatments at a high temperature, so that diffusion of boron from the semiconductor layer is precluded as much as possible. In this manner, sharp doping profiles for the base zone are obtained.

A drawback of the two known methods resides in that, owing to the relatively high p-type doping with a concentration of $1.10^{19}$ atoms per cc, the second semiconductor layer can only be used as a base zone for an npn-transistor (a transistor with an n-type doped emitter zone, a p-type doped base zone and an n-type doped collector zone). It is not possible to form a base zone for a pnp-transistor (a transistor with a p-type doped emitter zone, an n-type doped base zone and a p-type doped collector zone) in the second semiconductor layer. To realize an n-type base zone, said high p-type doping would have to be redopedso as to obtain an n-type doping with a doping concentration equal to or below that of the p-type base zone by adding an n-type dopant. This is impossible. As a result, both said methods cannot suitably be used to manufacture circuits comprising both types of transistors in a simple manner.

SUMMARY OF THE INVENTION

It is an object of the invention to provide inter alia a method which enables integrated circuits to be manufactured which comprise bipolar HBT transistors of the npn-type as well as the pnp-type.

To achieve this, the method mentioned in the opening paragraph is characterized, in accordance with the invention, in that the second semiconductor layer of monocrystalline silicon with 5 to 25 at. % germanium is deposited without a base doping, and this base doping is introduced into this second semiconductor layer at a later stage.

The desired base doping can be brought about in a customary manner by ion implantation or by a VPD (Vapor Phase Doping) process. In a VPD process, atoms from a vapor of a dopant (such as phosphine or diborane) are introduced into the semiconductor layers by diffusion. The second semiconductor layer of silicon with germanium can thus be provided with both an n-type and a p-type base doping. As a result, npn-transistors and pnp-transistors can be made side by side in the three semiconductor layers. The doping profiles which can thus be realized are not as sharp as those which can be realized by means of the known, above-mentioned methods.

Surprisingly, it has been found that the method in accordance with the invention enables npn-transistors to be made which are suitable for processing signals of frequencies up to 40 GHz and which have a current amplification factor above 100. These transistors can thus suitably be used in integrated circuits for wireless communication systems. The heterojunction npn-transistors manufactured by means of the known, above-described methods are capable of processing signals of higher frequencies, however, said known methods enable only transistors of one type to be manufactured in a simple manner. Bipolar transistors which are made entirely of silicon and hence comprise base zones made of silicon to which no germanium is added can only be used in practice to process signals having frequencies up to 20 GHz.

If the second semiconductor layer of monocrystalline silicon with 5 to 25 at. % germanium is deposited in a thickness in the range from 10 to 30 nm, then the stresses in this semiconductor layer are so small that field-oxide regions can be formed in the three semiconductor layers by local oxidation of silicon. For this purpose, the wafer is heated, for example, for 1 hour in steam at a temperature of 1000° C. As a result, the germanium diffuses slightly from the second semiconductor layer into the underlying and overlying layers, but the semiconductor layer remains free of dislocations. In the three semiconductor layers, transistors can be formed which exhibit the above-mentioned favorable high-frequency behavior.

During the deposition of the three semiconductor layers, the first semiconductor layer is provided with a doping which can serve as a collector doping of the npn-transistor. To obtain a simple deposition process, all three semiconductor layers are doped during their deposition with an n-type dopant and a doping concentration from 1 to $10.10^{15}$ atoms per cc. In the first monocrystalline-silicon semiconductor layer a doping is thus provided which can serve as a doping of a collector zone of an npn-transistor, while the doping is so light that it can be readily compensated in the second and the third semiconductor layer by a desirable base doping of 3 to $6.10^{18}$ atoms per cc and a desirable emitter doping of 1 to $5.10^{20}$ atoms per cc. By providing all three layers, not just the first semiconductor layer, with the n-type dopant, it is additionally precluded that the dopant will diffuse, during the deposition process, from the first semiconductor layer into the second and the third semiconductor layer to be deposited thereon.

Preferably, regions of field oxide are formed in the three semiconductor layers, which regions enclose active regions wherein npn-type transistors having pn-junctions extending parallel to the surface are formed and active regions wherein pnp-type transistors having pn-junctions extending transversely to the surface are formed. In the npn-transistors, the pn-junctions are situated below each other; these "vertical" npn-transistors correspond to the transistors made by means of the known, above-described methods. This method enables "horizontal" pnp-transistors having adjacent pn-junctions to be provided next to the "vertical" npn-transistors by means of only one additional masking step. This additional mask is used to shield the active regions of the "vertical" npn-transistors during the formation of the base zones of the "horizontal" pnp-transistors. Thus, "horizontal" pnp-transistors can be manufactured by means of which signals having frequencies up to approximately 2 GHz can be processed with a current-amplification factor above 100. By virtue of their high current-amplification factor, these pnp-transistors can be used, for example, in circuits in current sources or, in combination with the "vertical" npn-transistors which also exhibit a current-amplification factor above 100, in current mirrors (?). It is to be noted that comparable "horizontal" pnp-transistors formed in semiconductor layers containing only silicon will exhibit a current-amplification factor of approximately 5.

The next stages in the method can be carried out in a simple manner if the third semiconductor layer of monocrystalline silicon is successively provided with a p-type doped layer of polycrystalline silicon and a layer of an insulating material, whereafter, in both layers, windows are formed through which the base zones of the npn-transistors are formed and windows are formed through which the base zones of the pnp-transistors are formed. In the formation of the base zones of the transistors, by means of an ion implantation process or a VPD process, both layers comprising the windows can be used as a mask. During the formation of the base zones of the npn-transistors, the windows must be shielded at the location of the active regions for the pnp-transistors, and during the formation of the base zones of the pnp-transistors, the windows must be shielded at the location of the active regions for the npn-transistors. The necessary masks may be provided with apertures which are larger than said windows and need not be accurately aligned with respect to the mask formed in the layer of polycrystalline silicon and the layer of insulating material situated thereon. Such non-critical masking steps may be carried out in a relatively simple manner.

To achieve a maximum reduction of the number of heat treatments which must be carried out after the formation of the base zones, connection zones for the base zones of the npn-transistors as well as the collector zones and emitter zones of the pnp-transistors are formed by diffusion of p-type dopant from the polycrystalline-silicon layer, after the formation of the windows in the layers but before the formation of the base zones, said connection, collector and emitter zones adjoining the windows formed in the p-type doped layer of polycrystalline silicon and the layer of insulating material.

Without additional masking steps, the emitter zones of the npn-transistors and the connection zones for the base zones of the pnp-transistors can be subsequently formed by diffusion of dopant from an n-type doped layer of polycrystalline silicon, which is deposited in the windows after said windows have been provided with an insulating edge on their wall.

These and other aspects of the invention will be apparent from and elucidated with reference to the embodiment(s) described hereinafter.

BRIEF DESCRIPTION OF THE DRAWING

In the drawings:

FIGS. 1 through 13 are diagrammatic, cross-sectional views of stages in the manufacture of a semiconductor device comprising npn-type and pnp-type bipolar transistors, using a wafer of silicon 1 with a surface 2 as the starting material. For the sake of simplicity, the drawings only show the manufacture of one npn-transistor and one pnp-transistor. It will be obvious that, in practice, a semiconductor device comprising an integrated circuit can comprise a large number of both types of transistors. The part of the surface 2 wherein the vertical npn-transistor is formed is referenced A, the part wherein the pnp-transistor is formed is referenced B.

DESCRIPTION OF THE PREFERRED EMBODIMENTS

Figure 1:
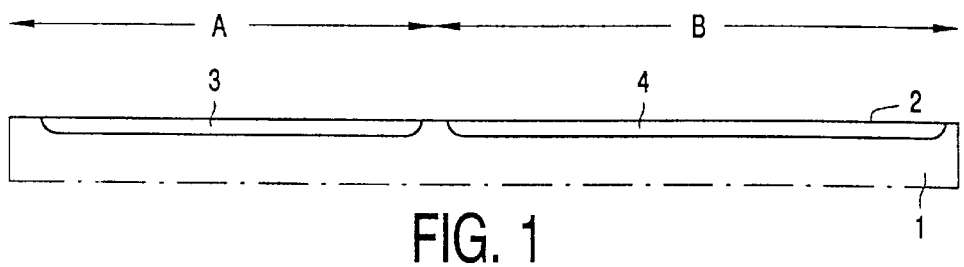
FIGS. 1 through 13 are diagrammatic, cross-sectional views of a few stages in the manufacture of a semiconductor device comprising heterojunction bipolar transistors, using the method in accordance with the invention.
Figure 2:
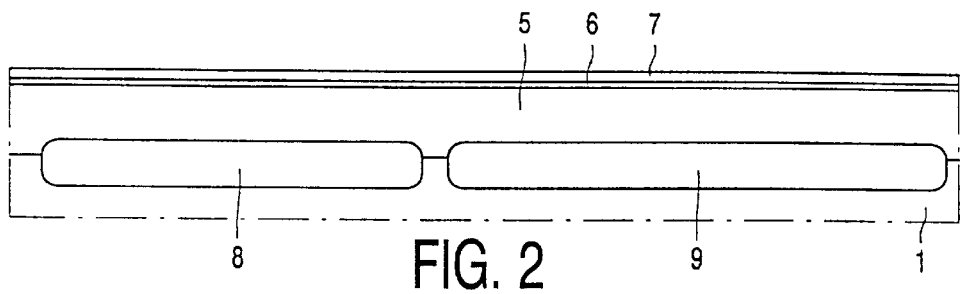

N-type doped zones 3 and 4 are formed in the surface 2 of the silicon wafer 1, as shown in FIG. 1, in a customary manner by ion implantation at the location of A and B of the transistors to be formed. Subsequently, as shown in FIG. 2, a first semiconductor layer 5 of monocrystalline silicon, a second semiconductor layer 6 of monocrystalline silicon with 5 to 25 at. % germanium and a third semiconductor layer 7 of monocrystalline silicon are successively provided by means of epitaxial deposition. In this example, an approximately 700 nm thick first semiconductor layer 5 of monocrystalline silicon, an approximately 20 nm thick second semiconductor layer 6 of monocrystalline silicon with 20 at. % germanium and an approximately 100 nm thick third semiconductor layer 7 of monocrystalline silicon are successively deposited in a customary manner by means of a CVD (Chemical Vapor Deposition) process. In the course of the deposition process, wherein the wafer is heated to a temperature of approximately 800° C., the n-type buried layers 8 and 9 having a doping concentration of approximately $10^{20}$ atoms per cc are formed from the implanted zones 4 and 5.

The base zones of the transistors are formed in the second semiconductor layer 6 of monocrystalline silicon with germanium. Heterojunction bipolar transistors (HBTs) are thus realized, which are particularly suited for processing signals of a very high frequency, such as signals used in systems for mobile communication. The second semiconductor layer of monocrystalline silicon with germanium is deposited without a base doping. This second layer is provided with a base doping at a later stage.

This can be carried out in a customary manner by ion implantation or by a VPD (Vapor Phase Doping) process. In a VPD process, atoms from a vapor of a dopant (such as phosphine or diborane) are introduced into the semiconductor layers by diffusion. npn-transistors and pnp-transistors can then be manufactured side by side in the three semiconductor layers 5, 6 and 7. The doping profiles thus realized are not as sharp as those realized when the layer of silicon with germanium is doped during the deposition process. Surprisingly it has been found, however, that the method in accordance with the invention enables npn-transistors with a current-amplification factor above 100 to be manufactured, which are suited for processing signals having frequencies up to 40 GHz. These transistors can thus suitably be used in integrated circuits for said wireless communication systems.

Figure 3:
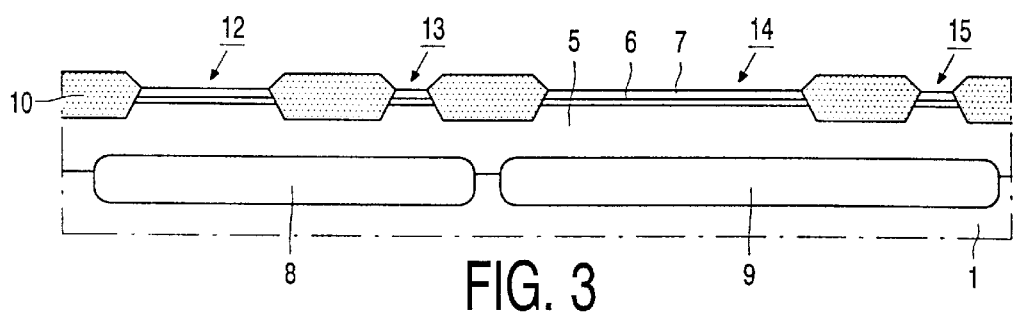

Preferably, the second semiconductor layer 6 of monocrystalline silicon with 5 to 25 at. % germanium is deposited in a thickness in the range from 10 to 30 nm. The stresses in such a layer are so small that field oxide regions can be formed in the three semiconductor layers by local oxidation of silicon. In this example, after the deposition of the three semiconductor layers 5, 6 and 7, as shown in FIG. 3, regions of field oxide 10 are formed by local oxidation of silicon to insulate the transistors to be formed with respect to each other. When these regions 10 are formed, the silicon wafer is heated for 1 hour in vapor heated to a temperature of approximately 1000° C. As the semiconductor layer 6 of silicon with germanium is applied in said small thickness, no dislocations are formed during the high-temperature treatment. During the heating process, germanium does diffuse from the second semiconductor layer into the underlying and overlying layers. After the formation of the regions of field oxide 10, a thicker layer 11 of silicon having a smaller concentration of germanium is formed. After the deposition, the layer 6 had a thickness of approximately 20 nm and a germanium concentration of approximately 20 at. %; after the formation of the regions of field oxide 10, the layer 11 has a thickness of approximately 25 nm and a germanium concentration of approximately 15 at. %. It has been found that transistors having the above-mentioned favorable high-frequency behavior can be formed in the three semiconductor layers 5, 11 and 7.

In this example, the three semiconductor layers 5, 6 and 7 are doped, during their deposition, with an n-type dopant in a doping concentration of $5.10^{15}$ atoms per cc. As a result, the doping introduced into the first semiconductor layer 5 of monocrystalline silicon can serve as a doping of a collector zone of an npn-transistor, while the doping is so light that it can be easily compensated by a desired base doping and emitter doping in the second and the third semiconductor layer 6 and 7.

Figure 4:
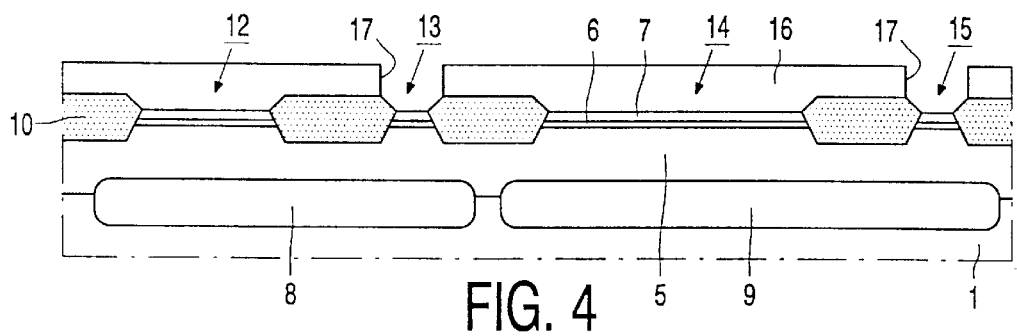

In the region A where the npn-transistor is formed, the regions of field oxide 10 enclose an active region 12 and a connection region 13 for the buried layer 8, and in the region B where the pnp-transistor is formed, they enclose an active region 14 and a connection region 15 for the buried layer 9. After the formation of the regions of field oxide 10, a photoresist mask 16, having windows 17 within which the connection regions 13 and 15 are exposed, is formed, as shown in FIG. 4. The n-type doped connection zones 18 and 19 enabling electric contact with the buried layers 8 and 9 are formed in a customary manner by means of ion implantation.

In the active region 12, an npn-type transistor having pn-junctions extending parallel to the surface is formed, and in the active region 14, a pnp-type transistor having pn-junctions extending transversely to the surface is formed. Apart from the "vertical" npn-transistors having pn-junctions situated below each other in regions A, "horizontal" pnp-transistors having adjacent pn-junctions can be formed in regions B by means of only one additional masking step, which will be shown in FIG. 7. This additional mask serves to shield the active regions of the "vertical" npn-transistors during the formation of the base zones of the "horizontal" pnp-transistors.

Figure 5:
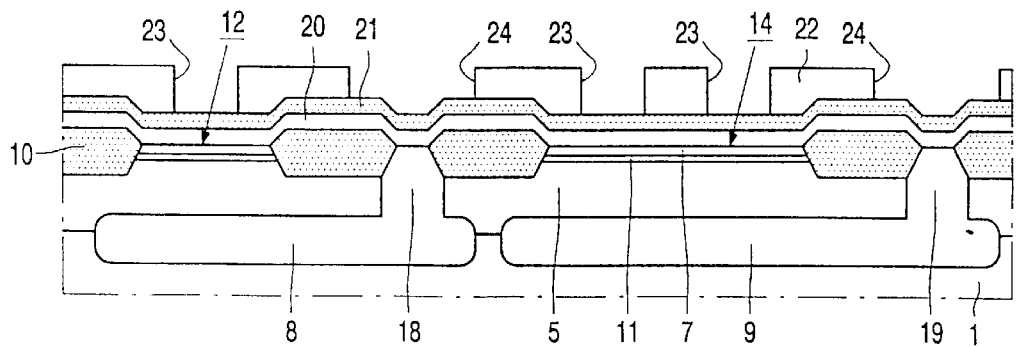

After the formation of the connection zones 18 and 19, an approximately 300 nm thick layer of p-type doped polycrystalline silicon 20 and a layer of an insulating material 21, in this case an approximately 300 nm thick layer of silicon oxide, are deposited in a customary manner as shown in FIG. 5. Doping of the layer of polycrystalline silicon 20 can be carried out during the deposition or after the deposition by means of ion implantation. A photoresist mask 22 having windows 23 and 24 is formed on the layer of silicon oxide 21, after which the layers of polycrystalline silicon 20 and silicon oxide 21 are etched in a pattern corresponding to the photoresist mask 22. Strip-shaped windows 26, 27 and 28 extending transversely to the plane of the drawing are thus formed in the layers 20 and 21, the window 27 consisting of two parallel strips. The connection zones 18 and 19 are exposed at the location of the windows 28.

The base zones of both types of transistors will be formed through the windows 26 and 27 in the layer of polycrystalline 20 and the layer of silicon oxide 21. When the base zones of the transistors are formed by means of ion implantation or a VPD process, the two layers 20 and 21 with the windows 26 and 27 formed therein serve as a mask. To reduce the number of heat treatments to be carried out after the formation of the base zones as much as possible, a heat treatment is carried out after the formation of the windows 26, 27 and 28 in the layers 20 and 21, but before the formation of the base zones, said heat treatment resulting in the formation of connection zone 29 for the base zones of the npn-transistors as well as collector zone 30 and emitter zone 31 of the pnp-transistors by diffusion of p-type dopant from the layer of polycrystalline silicon, said connection, collector and emitter zones adjoining the windows 26 and 27 formed in the p-type doped layer of polycrystalline silicon and in a layer of an insulating material.

Like the collector zone 30, the connection zones 29 form two parallel strips; the emitter zone 31 forms a single strip extending parallel to the collector zones 30.

Figure 6:
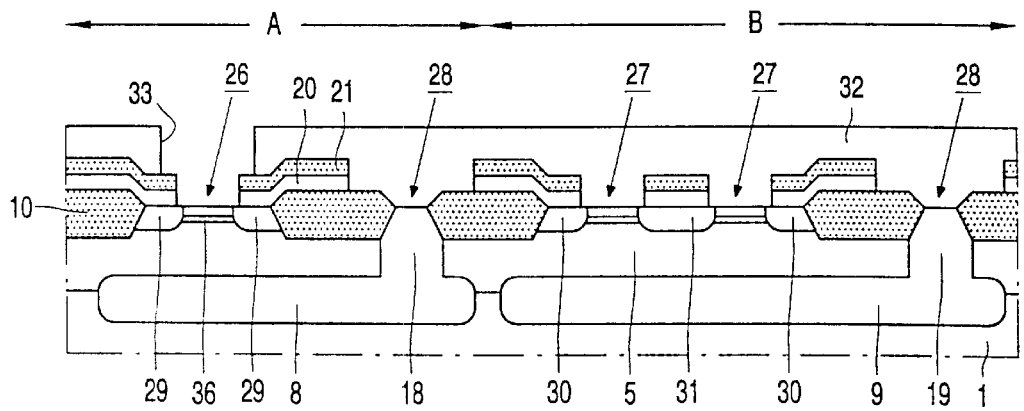
Figure 7:
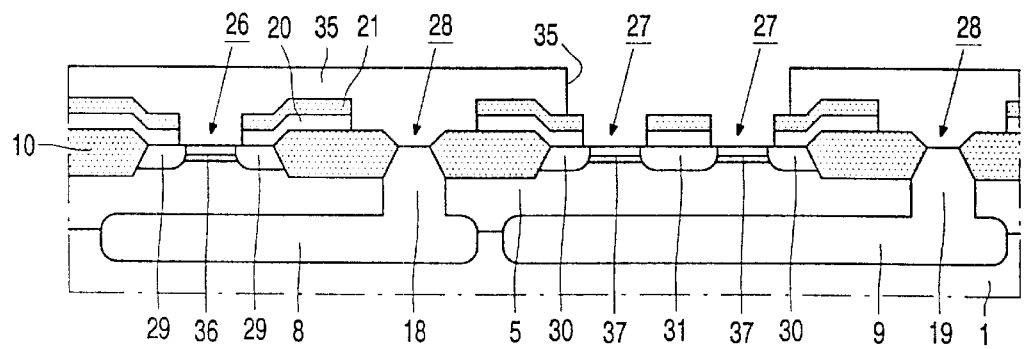

During the formation of the base zone of the npn-transistor, the windows 27 are shielded by a mask 32 at the location of the active region 14 for the pnp-transistors, as shown in FIG. 6, and during the formation of the base zones of the pnp-transistors, the windows 26 are shielded by a mask 35 at the location of the active region 12 for the npn-transistor, as shown in FIG. 7. The masks 32 and 34 necessary for this purpose are provided with apertures 33 and 35, respectively, which are larger than said windows 26 and 27, and they do not have to be accurately aligned with respect to the mask formed in the layer of polycrystalline silicon 20 and the layer of insulating material 21 situated thereon. Such non-critical masking steps can be carried out in a relatively simple manner. It is to be noted that the mask 32 also covers the windows 28. Consequently, this mask is necessary, also if no pnp-transistors are manufactured next to the npn-transistors. Thus, the manufacture of pnp-transistors requires only one additional mask 35.

After the provision of the mask 32, in this case a photoresist mask, the base zone 36 is formed, as shown in FIG. 6, through the window 33 in the mask 32 and the window 26 in the layers 20 and 21, in this example, by implantation in the semiconductor layer 11. The base zone 36 is p-type doped by means of boron having a doping concentration of $5.10^{18}$ atoms per cc. After the formation of the base zone 36, the photoresist mask 32 is removed.

After the provision of the mask 34, here also a photoresist mask, the base zone 37 is formed through the windows 35 in the mask 34 and the window 27 in the layers 20 and 21 by implantation in the semiconductor layer 11. The base zone 37 is n-type doped by means of arsenic having a doping concentration of $5.10^{17}$ atoms per cc and extends in the form of two parallel strips between the collector zone 30 and the emitter zone 31. After the formation of the base zone 37, the photoresist mask 34 is removed.

Figure 8:
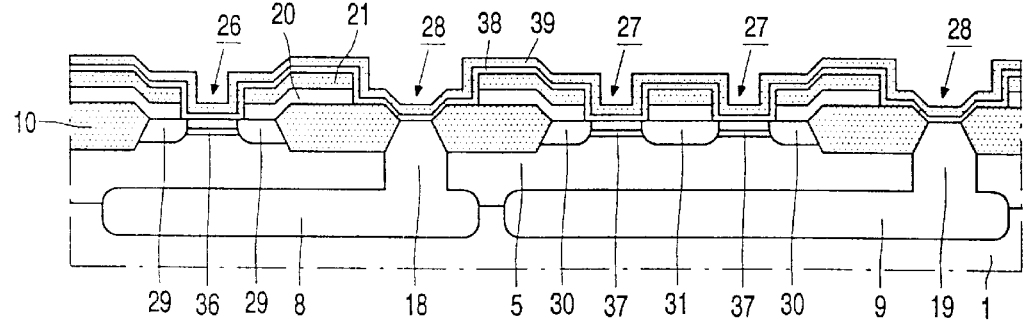
Figure 9:
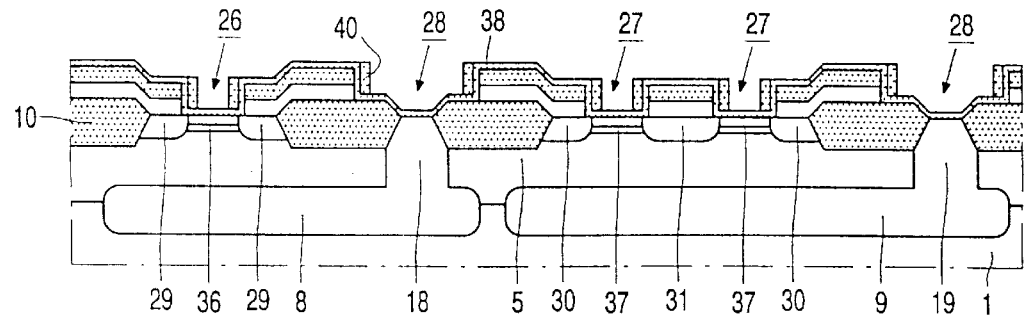
Figure 10:
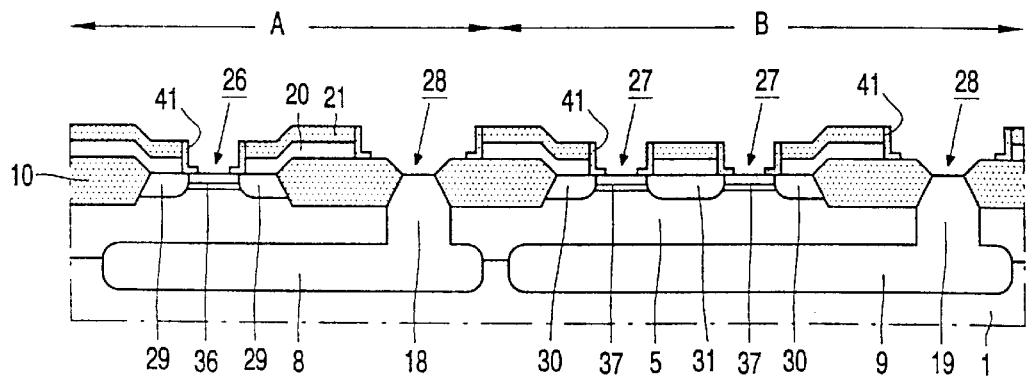

Subsequently, as shown in FIG. 8, in succession an approximately 50 nm thick layer of silicon nitride 38 and an approximately 200 nm thick layer of amorphous silicon 39 are deposited. The layer of amorphous silicon 39 is anisotropically etched until the silicon nitride layer is exposed. As shown in FIG. 9, edges of amorphous silicon 40 then remain on the walls of the windows 26 and 27 in the layers 20 and 21. Subsequently, the layer of silicon nitride 38 is etched, in which process the edges of amorphous silicon 40 are used for masking. After removal of the edges 40, there remain, as shown in FIG. 10, L-shaped edges 41 of silicon nitride on the walls of the windows 26 and 27.

Figure 11:
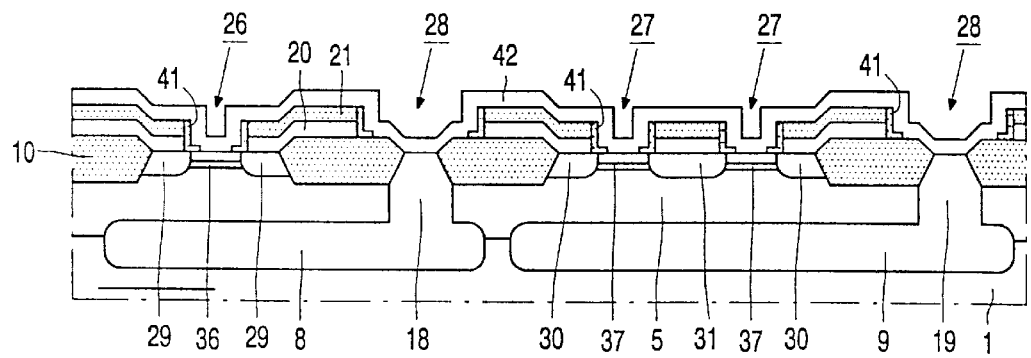

Subsequently, both the emitter zones of the npn-transistors and the base zones of the pnp-transistors are formed in a single process step. As shown in FIG. 11, an n-type doped layer of polycrystalline silicon 42 is deposited on the pattern wherein the p-type doped layer of polycrystalline silicon 20 and the layer of insulating material 21 present thereon are etched, as well as in the windows 26, 27 and 28 formed therein, after these windows have been provided with the insulating edge 41 on their walls. In this example, said layer of polycrystalline silicon is doped in the course of the deposition process with arsenic in a doping concentration of approximately $10^{21}$ atoms per cc.

Figure 12:
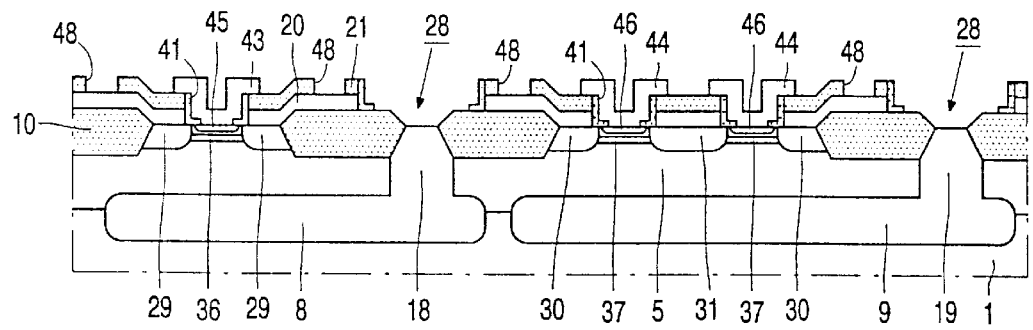

Subsequently, as shown in FIG. 12, a pattern of conductor tracks 43 and 44 is etched in this layer 42. The conductor track 43 serves to make contact with the emitter zone, to be formed, of the npn transistor, and the conductor track 44, which consists of two strips which are connected with each other outside the plane of the drawing, serves to make contact with the base zone 35 of the pnp-transistor. The emitter zone 38 of the pnp-transistor is connected to the part of the p-type polycrystalline silicon 20 situated above this zone, which p-type polycrystalline silicon is contacted, outside the plane of the drawing, by a conductor track, not shown, which is also formed in the layer 46.

Subsequently, the emitter zone 45 of the npn-transistor and the connection zone 46 for the base zone 37 of the pnp-transistors are formed by diffusion of dopant from the layer of n-type doped polycrystalline silicon 42 which is etched in accordance with a pattern. The collector of the npn-transistor is formed by the part 47 of the first semiconductor layer 5 which is situated below the base zone 36.

Figure 13:
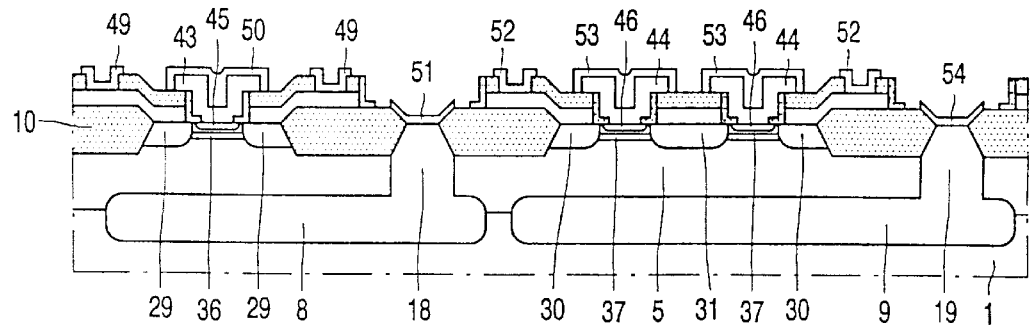

Finally, as shown in FIG. 12, windows 48 are formed in the layer of silicon oxide 21, through which windows contact can be made with the layer of polycrystalline silicon 20, and, as shown in FIG. 13, a metallization is formed including conductor tracks 49 for contacting the connection zone 29 of the base zone 36, a conductor track 50 for contacting the emitter zone 45, a conductor track 51 for contacting the connection zone 18, conductor tracks 52 for contacting the collector 30, conductor tracks 53 for contacting the connection zones 46 for the base zone 37, and a conductor track 54 for contacting the connection zone 19. The emitter zone 38 is contacted outside the plane of the drawing.

The transistors thus formed can suitably be applied in integrated circuits for wireless communication systems. The npn-transistors are capable of amplifying signals having frequencies up to 40 GHz and their current amplification factor is above 100. The pnp-transistors are capable of amplifying signals having frequencies up to 2 GHz, and their current amplification factor exceeds 100. By virtue of their high current amplification factor, these pnp-transistors can be applied, for example, in said circuits in current sources or, in combination with the "vertical" npn-transistors, which also have a current amplification factors above 100, in current mirrors.

What is claimed is:

1. A method of manufacturing a semiconductor device comprising bipolar transistors, in which method, in succession, a first semiconductor layer of monocrystalline silicon, a second semiconductor layer of monocrystalline silicon with 5 to 25 at. % germanium and a third semiconductor layer of monocrystalline silicon are provided on a surface of a silicon wafer by means of epitaxial deposition, base zones of the transistors being formed in the second semiconductor layer of monocrystalline silicon with germanium, characterized in that the second semiconductor layer of monocrystalline silicon with 5 to 25 at. % germanium is deposited without a base doping, and this base doping is introduced into this second layer at a later stage.

2. A method as claimed in claim 1, characterized in that the second semiconductor layer of monocrystalline silicon with 5 to 25 at. % germanium is deposited in a thickness in the range from 10 to 30 nm.

3. A method as claimed in claim 1, characterized in that the three semiconductor layers are doped, during their deposition, with an n-type dopant and a doping concentration in the range from 1 to $10.10^{15}$ atoms per cc.

4. A method as claimed in claim 2, characterized in that regions of field oxide are formed in the three semiconductor layers, which regions enclose active regions wherein npn-type transistors having pn-junctions extending parallel to the surface are formed and active regions wherein pnp-type transistors having pn-junctions extending transversely to the surface are formed.

5. A method as claimed in claim 1, characterized in that the third semiconductor layer of monocrystalline silicon is successively provided with a p-type doped layer of polycrystalline silicon and a layer of an insulating material, whereafter, in both layers, windows are formed through which the base zones of the npn-transistors are formed and windows are formed through which the base zones of the pnp-transistors are formed.

6. A method as claimed in claim 5, characterized in that prior to the formation of the base zones, connection zones for the base zones of the npn-transistors as well as the collector zones and emitter zones of the pnp-transistors are formed by diffusion of p-type dopant from the layer of polycrystalline silicon, which connection zones, collector zones and emitter zones are adjacent to the windows formed in the p-type doped layer of polycrystalline silicon and the layer of insulating material.

7. A method as claimed in claim 6, characterized in that the emitter zones of the npn-transistors and the connection zones for the base zones of the pnp-transistors are formed by diffusion of dopant from an n-type doped layer of polycrystalline silicon which is deposited in the windows after said windows have been provided with an insulating edge on their wall.

* * * * *